United States Patent [19]
Hayakawa

[11] Patent Number: 6,072,818
[45] Date of Patent: Jun. 6, 2000

[54] SEMICONDUCTOR LIGHT EMISSION DEVICE

[75] Inventor: Toshio Hayakawa, Kanagawa-ken, Japan

[73] Assignee: Fuji Photo Film Co., Ltd., Kanagawa-ken, Japan

[21] Appl. No.: 08/827,252

[22] Filed: Mar. 28, 1997

[30] Foreign Application Priority Data

Mar. 28, 1996 [JP] Japan .................................. 8-072221
Mar. 28, 1996 [JP] Japan .................................. 8-074220

[51] Int. Cl.⁷ .............................. H01S 3/19; H01L 23/48
[52] U.S. Cl. ................................. 372/46; 372/45; 257/745
[58] Field of Search ..................... 372/45, 46; 257/745, 257/743

[56] References Cited

U.S. PATENT DOCUMENTS

| | | | |
|---|---|---|---|
| 5,388,117 | 2/1995 | Nishimura | 372/45 |
| 5,400,354 | 3/1995 | Ludowise et al. | 372/45 |
| 5,600,667 | 2/1997 | Kidoguchi et al. | 372/45 |
| 5,636,236 | 6/1997 | Tada et al. | 372/45 |
| 5,706,304 | 1/1998 | Ohkura | 372/45 |
| 5,740,192 | 4/1998 | Hatano et al. | 372/45 |
| 5,834,331 | 11/1998 | Razeghi | 372/45 |
| 5,903,017 | 5/1999 | Itaya et al. | 372/45 |

OTHER PUBLICATIONS

Jpn. J. Appl. Phys. vol. 34, No. 7A, pp. L797–799, Nakamura et al. (Jul. 1995).
Jpn. J. Appl. Phys. vol. 35, No. 1B, pp. L74–76, Nakamura et al. (Jan. 1996).

*Primary Examiner*—Rodney Bovernick
*Assistant Examiner*—Quyen Phan Leung
*Attorney, Agent, or Firm*—Sughrue, Mion, Zinn, Macpeak & Seas, PLLC

[57] ABSTRACT

A semiconductor light emission device includes at least an n-type semiconductor clad layer, a semiconductor active layer and a p-type semiconductor clad layer formed on a substrate in this order. A stripe portion which determines a light emission region is formed on a part of the p-type clad layer and a p-type capping layer is formed on the stripe portion. A p-side electrode is formed on the p-type capping layer. The p-type capping layer includes a lower capping layer in the form of a stripe overlaid on the stripe portion and an upper capping layer which is formed on the lower capping layer and has an area larger than that of the lower capping layer. The contact area between the p-side electrode and the upper capping layer of the p-type capping layer is larger than that between the upper capping layer and the lower capping layer of the p-type capping layer.

4 Claims, 5 Drawing Sheets

F I G. 1
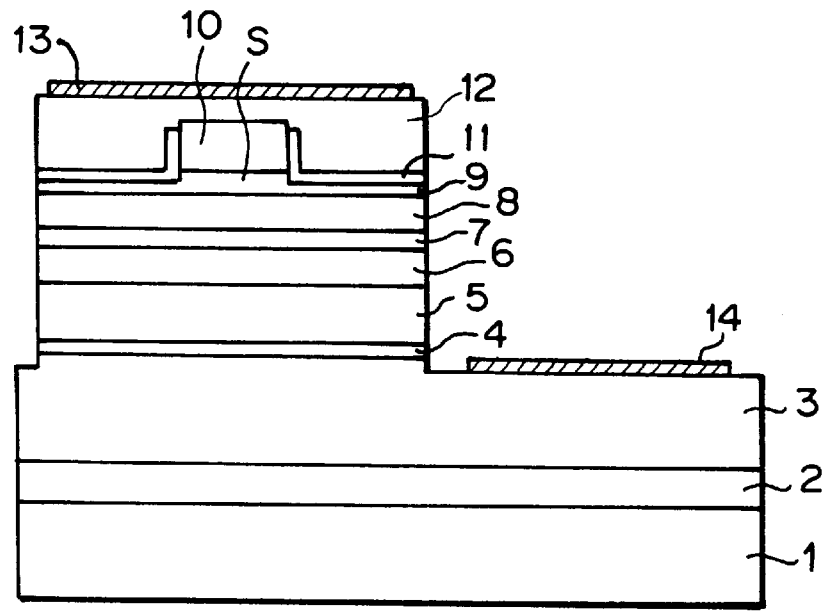
F I G. 2
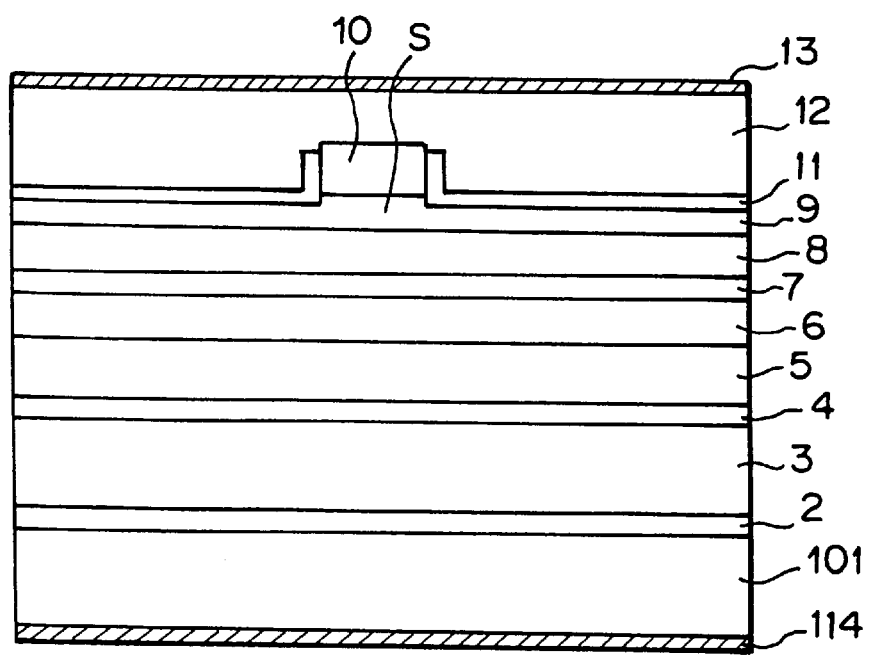

SEMICONDUCTOR LIGHT EMISSION DEVICE

BACKGROUND OF THE INVENTION

1. Field of the Invention

This invention relates to a semiconductor light emission device (LED) such as a light emission diode, a semiconductor laser and the like.

2. Description of the Related Art

There has been remarked an AlInGaN type LED or semiconductor laser as a source of light having a wavelength shorter than 500 nm. This material has very excellent properties as a high brightness LED emitting light of a wavelength in a blue to green wavelength range (See Jpn. J. Appl. Phys. vol. 34, No. 7A, pp. L797–799 (1995): document 1) and is going to be put into practice as a light source for a signal, an outdoor display and the like. Further recently there has been reported pulse oscillation at 417 nm of a semiconductor laser at room temperatures (See Jpn. J. Appl. Phys. vol. 35, No. 1B, pp. L74–76 (1996): document 2).

The AlInGaN type semiconductor laser described in the document 2 is disadvantageous in that heat production of the device and modulation distortion are large since the operating voltage upon generation of pulse oscillation is as high as several ten volts and the power fed to the device during oscillation is not smaller than about ten times that of normal devices due to very high contact resistance between a p-type semiconductor layer and an electrode. Thus reduction of impedance of the device is a problem.

Further since the AlInGaN type semiconductor laser can produce a beam spot much smaller in diameter than that of a 630 nm semiconductor laser, which has been put into practice, can produce, application of the AlInGaN type semiconductor laser to a high density optical disk memory is expected. For this purpose, it is necessary to realize oscillation in a single mode so that a stabilized light beam is obtained, and in the case of a short wavelength range of 360 to 500 nm at which the AlInGaN type semiconductor laser is expected to oscillate, it is necessary that the width of the stripe of an optical waveguide incorporated in the device in order to stabilize the transverse mode is about 2 $\mu$m or less.

However in the case of the conventional device described in the aforesaid document, since an n-type semiconductor layer is first formed on a substrate and then a p-type semiconductor layer is formed on the n-type semiconductor layer, the contact area between the p-type semiconductor layer and a p-side electrode is narrowed when a narrow stripe is formed, which further increases the impedance.

Thus there has been a demand toward reduction in the impedance of the device in a semiconductor light emission device where the resistivity of the p-type semiconductor layer is high and the contact resistance between the p-type semiconductor layer and the p-side electrode.

SUMMARY OF THE INVENTION

In view of the foregoing observations and description, the primary object of the present invention is to provide a semiconductor light emission device which is low in impedance.

The semiconductor light emission device in accordance with a first aspect of the present invention comprises at least an n-type semiconductor clad layer, a semiconductor active layer and a p-type semiconductor clad layer formed on a substrate in this order, a stripe portion which determines a light emission region being formed on a part of the p-type clad layer, a p-type capping layer being formed on the stripe portion and a p-side electrode being formed on the p-type capping layer and is characterized in that said p-type capping layer comprises a lower capping layer in the form of a stripe overlaid on the stripe portion and an upper capping layer which is formed on the lower capping layer and has an area larger than that of the lower capping layer and the contact area between the p-side electrode and the upper capping layer of the p-type capping layer is larger than that between the upper capping layer and the lower capping layer of the p-type capping layer.

That is, in accordance with the first aspect of the present invention, the impedance of the device is lowered by enlarging the contact area between the p-side electrode and the p-type semiconductor layer which is large in the contact resistance with an electrode.

The upper capping layer may comprise a portion which is overlaid on the lower capping layer and an overhang portion which stands out from the lower capping layer.

The overhang portion may be formed on an insulating film formed on the part of the p-type clad layer other than the stripe portion.

The semiconductor light emission device may be of an $Al_xIn_yGa_{1-x-y}N(0 \leq x, y \leq 1)$ type.

Thus in accordance with the first aspect of the present invention, the impedance of the device is lowered by enlarging the contact area between the p-side electrode and the p-type semiconductor layer as compared with conventional devices. As a result, the operating voltage can be reduced and a semiconductor light emission device stabilized in the transverse mode can be provided.

Accordingly, the operating speed and the quality of a hard copy output system for outputting prints, photographs, medical images and the like can be improved, and at the same time, the quality of high density optical memories can be improved.

In accordance with a second aspect of the present invention, there is provided an $Al_xIn_yGa_{1-x-y}N(0 \leq x, y \leq 1)$ type semiconductor light emission device comprising a semiconductor layer formed on a substrate, the semiconductor layer including at least a p-type clad layer, an active layer and an n-type clad layer formed on the substrate in this order, the semiconductor layer being electrically connected to an n-side electrode formed on the semiconductor layer only through a narrow stripe portion formed on the semiconductor layer and/or the n-side electrode, thereby causing the semiconductor light emission device to oscillate in a single mode, and a p-side electrode being formed on the side of the p-type clad layer, wherein the improvement comprises that the contact area between the p-side electrode and the semiconductor layer is larger than the area of the stripe portion.

In accordance with the second aspect of the present invention, since the p-type semiconductor layer, which is inherently high in resistivity and contact resistance with an electrode, is formed adjacent to the substrate and a stripe portion need not be formed in the p-type semiconductor layer, the p-type semiconductor layer can be in contact with the p-side electrode in a relatively large area, whereby the impedance of the device can be lowered. Accordingly, the operating voltage of the device can be lowered and at the same time, the efficiency and the output power of the device can be improved. Further the modulation frequency can be increased and the modulation distortion can be suppressed. Thus the operating speed and the quality of a hard copy output system for outputting prints, photographs, medical images and the like can be improved.

BRIEF DESCRIPTION OF THE DRAWINGS

FIG. 1 is a schematic cross-sectional view showing a semiconductor laser in accordance with a first embodiment of the present invention, FIG. 2 is a schematic cross-sectional view showing a semiconductor laser in accordance with a second embodiment of the present invention.

DESCRIPTION OF THE PREFERRED EMBODIMENTS

Figure 3:
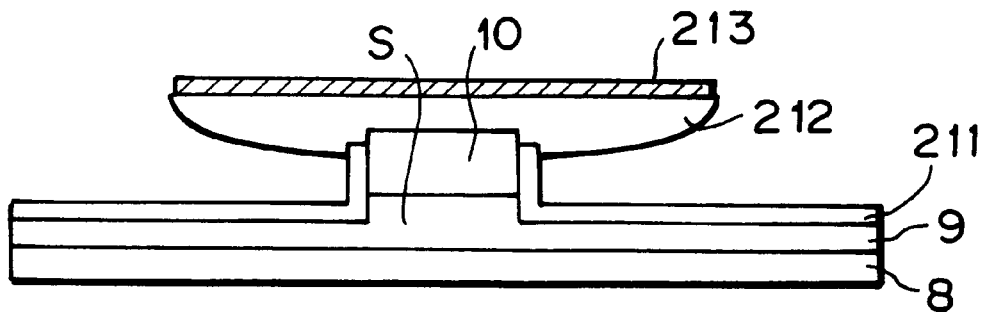
FIG. 3 is a schematic cross-sectional view showing a semiconductor laser in accordance with a third embodiment of the present invention.

First to ninth embodiments of the present invention will be described with reference to the drawings, hereinbelow. The first to fifth embodiments are in accordance with the first aspect of the present invention and sixth to ninth embodiments are in accordance with the second aspect of the present invention.

The semiconductor laser in accordance with the first embodiment of the present invention shown in FIG. 1 is produced in the following manner. That is, an n-GaN low-temperature buffer layer 2, an n-GaN buffer layer 3 (Si-doped, 5 $\mu$m thick), an n-In$_{0.1}$Ga$_{0.9}$N buffer layer 4 (Si-doped, 0.1 $\mu$m thick), an n-Al$_{0.15}$Ga$_{0.85}$N clad layer 5 (Si-doped, 0.5 $\mu$m thick), an n-GaN light guide layer 6 (Si-doped, 0.1 $\mu$m thick), an undoped active layer 7, a p-GaN light guide layer 8 (Mg-doped, 0.1 $\mu$m thick), a p-Al$_{0.15}$Ga$_{0.85}$N clad layer 9 (Mg-doped, 0.5 $\mu$m thick), and a p-GaN lower capping layer 10 (Mg-doped, 0.2 $\mu$m thick) are grown on a sapphire c-face substrate 1 by MOCVD method. The active layer 7 is formed of three layers, an undoped Al$_{0.04}$Ga$_{0.96}$N barrier layer 0.01 $\mu$m thick, an undoped In$_{0.2}$Ga$_{0.8}$N quantum well layer 3 nm thick, and an undoped Al$_{0.04}$Ga$_{0.96}$N barrier layer 0.01 $\mu$m thick.

Then a ridge stripe about 2.2 $\mu$m wide is formed by removing a part of the p-Al$_{0.15}$Ga$_{0.85}$N clad layer 9 and the lower capping layer 10 by photolithography and etching with a p-Al$_{0.15}$Ga$_{0.85}$N clad layer 9 of 0.1 $\mu$m thickness left there. That is, the ridge stripe thus obtained comprises a stripe portion S of the p-Al$_{0.15}$Ga$_{0.85}$N clad layer 9 and a stripe-like lower capping layer 10 overlaid on the stripe portion S of the p-Al$_{0.15}$Ga$_{0.85}$N clad layer 9.

Then a SiN film 11 is formed over the entire surface by plasma CVD and a part of the SiN film 11 on the upper surface of the lower capping layer 10 is removed by photolithography and etching.

Thereafter a p-GaN upper capping layer 12 (Mg-doped) is grown on the SiN film 11 and the upper surface of the lower capping layer 10 by a second MOCVD, and then p-type impurities are activated by heat treatment in a nitrogen gas atmosphere.

Then the epitaxial layer except the light emission region is removed to such an extent that the n-GaN buffer layer 3 is exposed by reactive ion beam etching with Cl ions. The end faces of the resonator can be formed by etching. However in this case, it is preferred that the width of the ridge be enlarged to at least about 10 $\mu$m at a portion corresponding to the end faces, thereby suppressing adverse influence of the shape of ridge on flatness of the end faces. (See "J. Quantum Electronics" vol. 27, pp. 1319–1331, 1991) When the end faces of the resonator are formed by cleavage, it is not necessary to enlarge the width of the ridge at the end faces.

Thereafter a Ti/Al/Ti/Au electrode and a Ni/Au electrode are formed by vacuum deposition respectively on the exposed part of the n-GaN buffer layer 3 and the upper capping layer 12 as an n-side electrode 14 and a p-side electrode 13 and annealed in nitrogen gas atmosphere, thereby forming ohmic electrodes.

As can be seen from FIG. 1, in the semiconductor laser of this embodiment, the upper capping layer 12 is in contact with the p-side electrode 13 in a larger area than with the lower capping layer 10.

When a conductive substrate 101 such as of SiC is used instead of a sapphire substrate (an insulating material) employed in the first embodiment, an n-side electrode 114 may be formed on the lower side of the substrate 101 as shown in FIG. 2 without removing the epitaxial layer except the light emission region so that a part of the n-GaN buffer layer 3 is exposed outward and the n.-side electrode 14 can be formed thereon as in the first embodiment.

A semiconductor laser in accordance with a third embodiment of the present invention will be described with reference to FIG. 3, hereinbelow. FIG. 3 shows only an upper part of the semiconductor laser in accordance with the third embodiment including the p-GaN light guide layer 8 and the upper layers. The layers lower than the p-GaN light guide layer 8 including the substrate may be the same as those in the first embodiment or of any other various structures.

In this embodiment, a p-GaN upper capping layer 212 is formed on the p-GaN lower capping layer 10 by growing the upper layer 212 selectively on the lower capping layer 10 by use of an insulating film 211 on which the p-GaN layer is hard to grow. The upper capping layer 212 thus obtained comprises a portion which is overlaid on the lower capping layer 10 and an overhang portion which stands out from the lower capping layer 10. Then a p-side electrode 213 is formed on the upper capping layer 212 over an area including the portion which is overlaid on the lower capping layer 10 and the overhang portion, whereby the contact area between the upper capping layer 212 and the p-side electrode 213 is made larger than the contact area between the upper capping layer 212 and the lower capping layer 10.

In a fourth embodiment of the present invention, though the ridge waveguide type transverse mode control is the same as in the preceding embodiments, grooves 314 about 5 $\mu$m wide are formed by etching on opposite sides of the ridge. A SiO$_2$ insulating film 311 is formed in the grooves 314 and on the lower capping layers 310 on opposite sides of the structure with the upper surface of the central lower capping layer 310 left uncovered. The insulating layer 311 may be formed, for instance, by spin coating and heat treatment of a coating material. Then a p-GaN layer is grown on the upper surface and the SiO$_2$ insulating film 311 to form an upper capping layer 312. The upper capping layer 312 thus obtained comprises a portion which is overlaid on the central lower capping layer 310 and an overhang portion which stands out from the central lower capping layer 310 and extends over the insulating layer 311. Then a p-side electrode 313 is formed on the upper capping layer 312 over an area including the portion which is overlaid on the central lower capping layer 310 and the overhang portion, whereby the contact area between the upper capping layer 312 and the p-side electrode 313 is made larger than the contact area between the upper capping layer 312 and the central lower capping layer 310.

Figure 4:
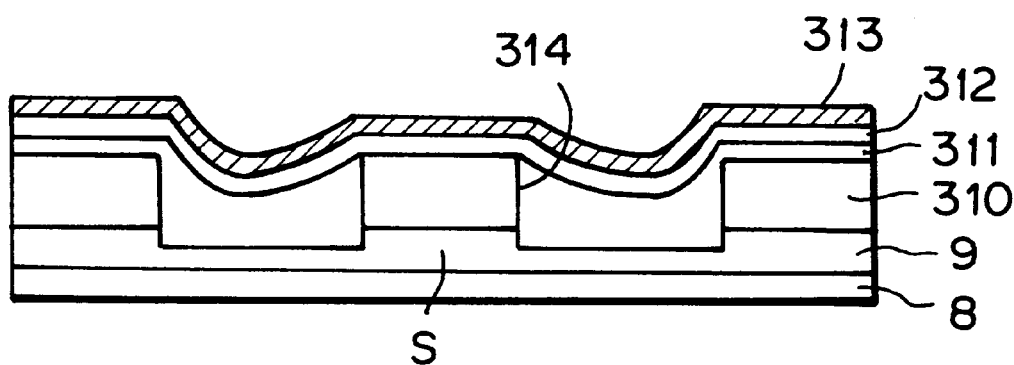
FIG. 4 is a schematic cross-sectional view showing a semiconductor laser in accordance with a fourth embodiment of the present invention.
Figure 5:
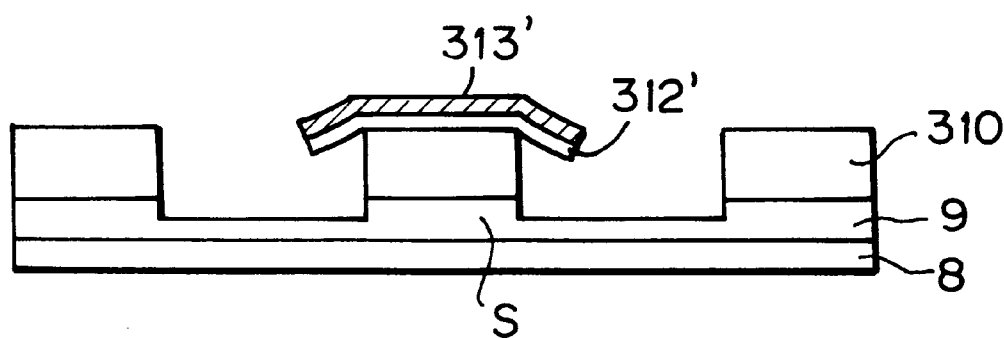
FIG. 5 is a schematic cross-sectional view showing a semiconductor laser in accordance with a fifth embodiment of the present invention.

A semiconductor laser in accordance with a fifth embodiment of the present invention shown in FIG. 5 is obtained by removing, from the structure shown in FIG. 4, the SiO$_2$ insulating film, the upper capping layer and the p-side electrode except a portion of the upper capping layer and the p-side electrode around the central lower capping layer. The SiO$_2$ insulating film can be removed, for instance, by wet etching while applying supersonic wave. Each of the upper capping layer 312' and the p-side electrode 313' comprises a portion which is overlaid on the central lower capping layer 310 and an overhang portion which stands out from the central lower capping layer 310. Accordingly also in this embodiment, the contact area between the upper capping layer 312' and the p-side electrode 313' is larger than the contact area between the upper capping layer 312' and the central lower capping layer 310.

In the first aspect of the present invention, various arrangements other than that described above may be employed as the layer arrangement of the semiconductor laser. For example, a multiple well structure and a double hetero structure without quantum well may be employed. Further as the substrate, various known substrates such as of a spinel structure (e.g., AlMg$_2$O$_4$) may be employed.

The resonator end faces may be formed by various methods other than etching, e.g., by cleavage or polishing.

Though the first aspect of the present invention is applied to a semiconductor laser in the first to fifth embodiments described above, it may also be applied to an end face emitting type LED.

Further the first aspect of the present invention may be applied to semiconductor light emission devices of any composition so long as an n-type semiconductor layer is on the substrate side while a p-type semiconductor layer is on the current pouring window side and the p-type semiconductor layer is high in resistivity and contact resistance with an electrode.

Figure 6:
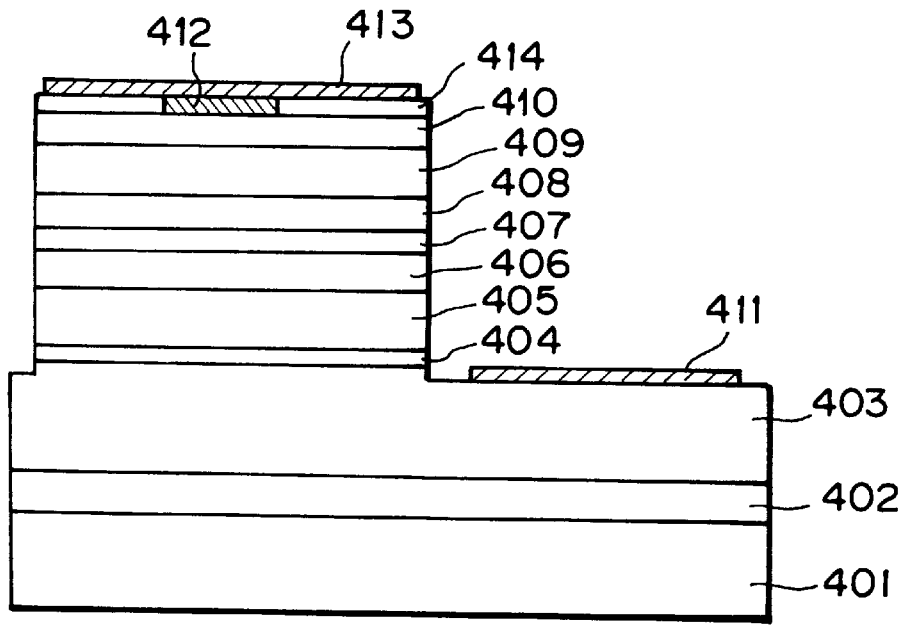
FIG. 6 is a schematic cross-sectional view showing a semiconductor laser in accordance with a sixth embodiment of the present invention.

The semiconductor laser in accordance with the sixth embodiment of the present invention shown in FIG. 6 is produced in the following manner. That is, a p-GaN low-temperature buffer layer 402, a p-GaN buffer layer 403 (Mg-doped, 5 μm thick), a p-In$_{0.1}$Ga$_{0.9}$N buffer layer 404 (Mg-doped, 0.1 μm thick), a p-Al$_{0.15}$Ga$_{0.85}$N clad layer 405 (Mg-doped, 0.5 μm thick), a p-GaN light guide layer 406 (Mg-doped, 0.1 μm thick), an undoped active layer 407, an n-GaN light guide layer 408 (Si-doped, 0.1 μm thick), an n-Al$_{0.15}$Ga$_{0.85}$N clad layer 409 (Si-doped, 0.5 μm thick), and an n-GaN capping layer 410 (Si-doped, 0.3 μm thick) are grown on a sapphire c-face substrate 401 by MOCVD method. The active layer 407 is formed of three layers, an undoped Al$_{0.04}$Ga$_{0.96}$N barrier layer 0.01 μm thick, an undoped In$_{0.2}$Ga$_{0.8}$N quantum well layer 3 nm thick, and an undoped Al$_{0.04}$Ga$_{0.96}$N barrier layer 0.01 μm thick.

Thereafter p-type impurities are activated by heat treatment in a nitrogen gas atmosphere.

Then a SiN film 414 is formed over the entire surface by plasma CVD and the SiN film 414 is removed by photolithography and etching except the light emission region. The epitaxial layer except the light emission region, that is, the part of the epitaxial layer corresponding to the part removed with the SiN film 414 is removed to such an extent that the p-GaN buffer layer 403 is exposed by reactive ion beam etching with Cl ions. The end faces of the resonator is formed at the same time. Then a current pouring window 412 (10 μm wide) is formed in the SiN film 414 on the light emission region.

Thereafter a Ti/Al/Ti/Au electrode and a Ni/Au electrode are formed by vacuum deposition respectively on the SiN film 414 over the current pouring window 412 and on the exposed part of the p-GaN buffer layer 403 as an n-side electrode 413 and a p-side electrode 411 and annealed in nitrogen gas atmosphere, thereby forming ohmic electrodes. The Ti/Al/Ti/Au electrode material fills the current pouring window 412 in the SiN film 414 to form a stripe portion projecting downward and the n-side electrode 413 is in electrical contact with the n-GaN capping layer 410 only through the stripe portion. The area of the p-side electrode 411 is larger than the area of the stripe portion of the n-side electrode 413 which is substantially equal to the area of the current pouring window 412. That is, contact area between the p-side electrode 411 and the p-GaN buffer layer 403 is larger than that between the n-side electrode 413 and the n-GaN capping layer 410.

Figure 7:
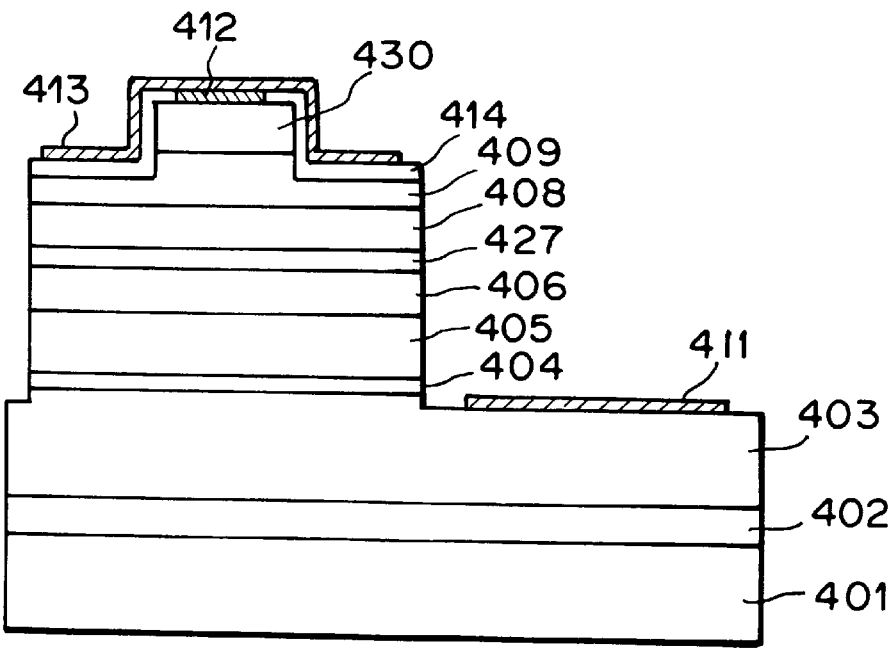
FIG. 7 is a schematic cross-sectional view showing a semiconductor laser in accordance with a seventh embodiment of the present invention.

The semiconductor laser in accordance with the seventh embodiment of the present invention shown in FIG. 7 is produced in the following manner. That is, a p-GaN low-temperature buffer layer 402, a p-GaN buffer layer 403 (Mg-doped, 5 μm thick), a p-In$_{0.1}$Ga$_{0.9}$N buffer layer 404 (Mg-doped, 0.1 μm thick), a p-Al$_{0.15}$Ga$_{0.85}$N clad layer 405 (Mg-doped, 0.5 μm thick), a p-GaN light guide layer 406 (Mg-doped, 0.1 μm thick), an undoped active layer 427, an n-GaN light guide layer 408 (Si-doped, 0.1 μm thick), an n-Al$_{0.15}$Ga$_{0.85}$N clad layer 409 (Si-doped, 0.5 μm thick), and an n-GaN capping layer 410 (Si-doped, 0.3 μm thick) are grown on a sapphire c-face substrate 401 by MOCVD method. The active layer 427 is formed of an undoped Al$_{0.04}$Ga$_{0.96}$N barrier layer (0.01 μm thick), a multiple quantum well structure consisting of four undoped In$_{0.2}$Ga$_{0.8}$N quantum well layers (3 nm thick) and three undoped In$_{0.1}$Ga$_{0.9}$N barrier layers (5 nm thick), and an undoped Al$_{0.04}$Ga$_{0.96}$N barrier layer (0.01 μm thick).

Thereafter p-type impurities are activated by heat treatment in a nitrogen gas atmosphere.

Figure 8:
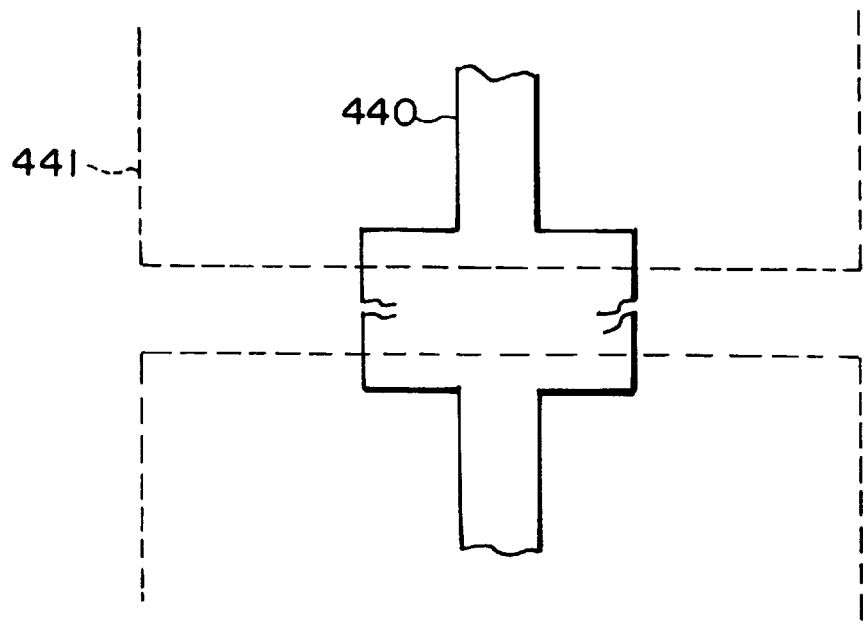
FIG. 8 is a view for illustrating the relation between the ridge stripe and the position in which a resonator end face is formed in the seventh embodiment.

Then a ridge stripe 430 about 2.2 μm wide is formed by removing a part of the n-Al$_{0.15}$Ga$_{0.85}$N clad layer 409 and the capping layer 410 by photolithography and etching with an n-Al$_{0.15}$Ga$_{0.85}$N clad layer of 0.1 μm thickness left there. The width of the ridge 430 is enlarged to about 20 μm at a portion in which end faces of the resonator are to be formed later as shown in FIG. 8 which is a schematic plan view showing the part of the ridge 430 near an end thereof. This is for suppressing adverse influence of the shape of ridge on flatness of the end faces. (See "J. Quantum Electronics" vol. 27, pp. 1319–1331, 1991) In FIG. 8, the solid line 440 shows the shape of the ridge to be formed by etching and the broken line 441 shows the shape of the end face of the resonator to be formed by etching.

Then a SiN film 414 is formed over the entire surface by plasma CVD and the SiN film 414 is removed by photolithography and etching except the light emission region. The epitaxial layer except the light emission region, that is, the part of the epitaxial layer corresponding to the part removed with the SiN film 414 is removed to such an extent that the p-GaN buffer layer 403 is exposed by reactive ion beam etching with Cl ions. The end faces of the resonator is formed at the same time. Then a current pouring window 412 (10 $\mu$m wide) is formed in the SiN film 414 on the light emission region.

Thereafter a Ti/Al/Ti/Au electrode and a Ni/Au electrode are formed by vacuum deposition respectively on the SiN film 414 over the current pouring window 412 and on the exposed part of the p-GaN buffer layer 403 as an n-side electrode 413 and a p-side electrode 411 and annealed in nitrogen gas atmosphere, thereby forming ohmic electrodes. The Ti/Al/Ti/Au electrode material fills the current pouring window 412 in the SiN film 414 to form a stripe portion projecting downward and the n-side electrode 413 is in electrical contact with the n-GaN capping layer 410 only through the stripe portion. The area of the p-side electrode 411 is larger than the area of the stripe portion of the n-side electrode 413 which is substantially equal to the area of the current pouring window 412. That is, contact area between the p-side electrode 411 and the p-GaN buffer layer 403 is larger than that between the n-side electrode 413 and the n-GaN capping layer 410.

In the sixth and seventh embodiments, the n-side electrode 413 is in electrical contact with the GaN capping layer 410 in a width of about 2 to 10 $\mu$m while the contact area of the p-side electrode 411 with the p-GaN buffer layer 403 can be enlarged to 10 to 100 times as large as that of the n-side electrode 413 with the GaN capping layer 410, for instance, by enlarging the width of the semiconductor laser device. Accordingly even if the contact resistivity of the p-type semiconductor layer is 10 to 100 times as high as that of the n-type semiconductor layer, deterioration in performance of the device can be prevented. Further in the case where the resistance of the p-GaN buffer layer 403 gives rise to a problem, the resistance of the p-GaN buffer layer 403 can be lowered by increasing the thickness thereof.

Figure 9:
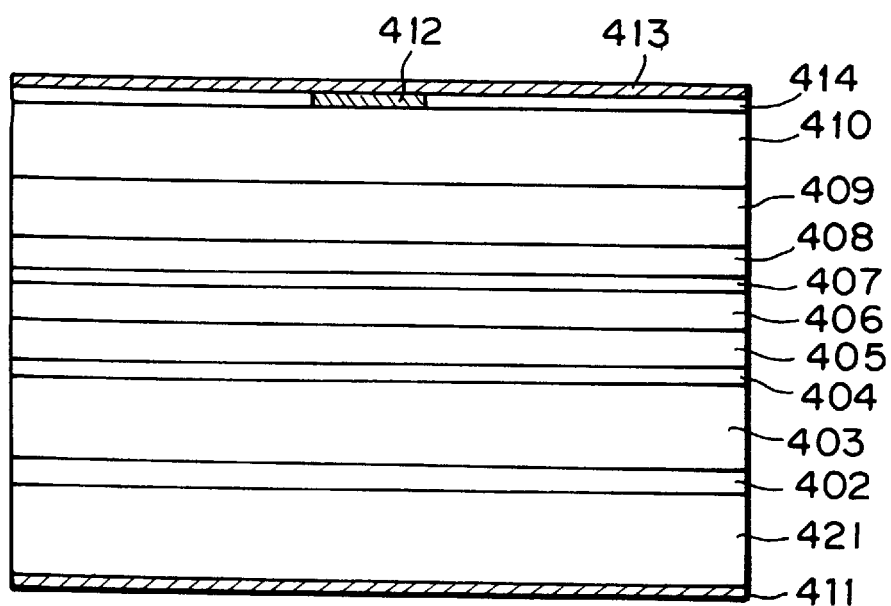
FIG. 9 is a schematic cross-sectional view showing a semiconductor laser in accordance with an eighth embodiment of the present invention.
Figure 10:
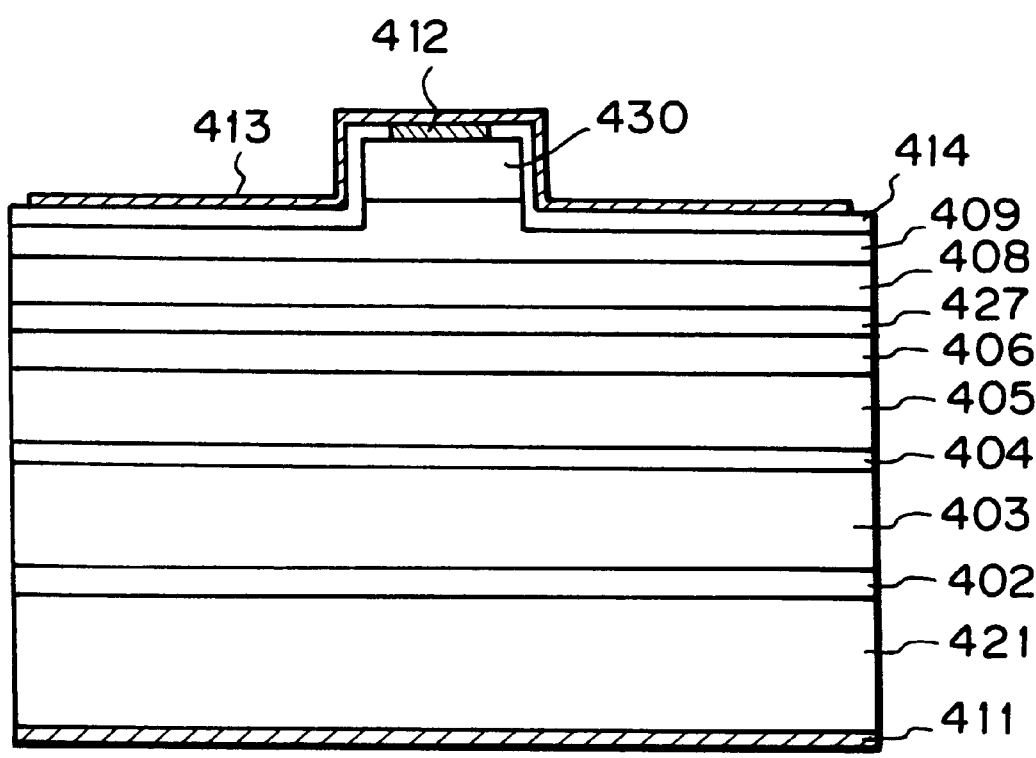
FIG. 10 is a schematic cross-sectional view showing a semiconductor laser in accordance with a ninth embodiment of the present invention.

When a conductive substrate 421 such as of SiC is used instead of a sapphire substrate (an insulating material) employed in the sixth and seventh embodiments, a p-side electrode 411 may be formed on the lower side of the substrate 401 as shown in FIGS. 9 (eighth embodiment) and 10 (ninth embodiment) without removing the epitaxial layer except the light emission region so that a part of the p-GaN buffer layer 403 is exposed outward and the p-side electrode 411 can be formed thereon as in the sixth and seventh embodiments.

In the second aspect of the present invention, various arrangements other than that described above may be employed as the layer arrangement of the semiconductor laser. For example, a double hetero structure without quantum well may be employed. Further as the substrate, various known substrates such as of a spinel structure (e.g., AlMg$_2$O$_4$) may be employed.

The resonator end faces may be formed by various methods other than etching, e.g., by cleavage or polishing.

Though the second aspect of the present invention is applied to a semiconductor laser in the sixth to ninth embodiments described above, it may also be applied to an end face emitting type LED. Also in the ordinary LED structure described in the aforesaid document 1, it is preferred that the upper electrode of the light emission region be as narrow as possible so that the area in which light is cut is reduced and the light extracting efficiency is increased. Accordingly the structure in accordance with the second aspect of the present invention where the n-type semiconductor layer is formed on the p-type semiconductor layer and the impedance of the device is low may be preferably applied to such a LED structure. Further in the case of a LED, more uniform light can be obtained as the spread of current just below the upper electrode increases and accordingly the structure in accordance with the second aspect of the present invention where the n-type semiconductor layer is formed on the p-type semiconductor layer and the impedance of the device is low is advantageous.

What is claimed is:

1. A semiconductor light emission device comprising at least an n-type semiconductor clad layer, a semiconductor active layer and a p-type semiconductor clad layer formed on substrate in this order, a stripe portion which determines a light emission region being formed on a part of the p-type clad layer, a p-type capping layer being formed on the stripe portion and a p-side electrode being formed on the p-type capping layer wherein the improvement comprises:

said p-type capping layer comprises a lower capping layer in the form of a stripe overlaid on the stripe portion and an upper capping layer which is formed on the lower capping layer and has an area larger than that of the lower capping layer and the contact area between the p-side electrode and the upper capping layer of the p-type capping layer is larger than that between the upper capping layer and the lower capping layer of the p-type capping layer wherein the p-side electrode is formed almost entirely on the p-type capping layer;

wherein said upper capping layer comprises a portion which is overlaid on the lower capping layer and an overhang portion which stands out from the lower capping layer; and wherein said overhang portion is formed on an insulating film formed on a part of the p-type clad other than the stripe portion.

2. A semiconductor light emission device comprising at least an n-type semiconductor clad layer, a semiconductor active layer and a p-type semiconductor clad layer formed on substrate in this order, a stripe portion which determines a light emission region being formed on a part of the p-type clad layer, a p-type capping layer being formed on the stripe portion and a p-side electrode being formed on the p-type capping layer wherein the improvement comprises:

said p-type capping layer comprises a lower capping layer in the form of a stripe overlaid on the stripe portion and an upper capping layer having a portion which is overlaid on the lower capping layer and an overhang portion which stands out from the lower capping layer and having an area larger than that of the lower capping layer;

wherein the overhang portion forms an air gap between the upper capping layer and the p-type clad layer; and wherein the contact area between the p-side electrode and the upper capping layer of the p-type capping layer is larger than the contact area between the upper capping layer and the lower capping layer of the p-type capping layer wherein the p-side electrode is formed on a majority of the p-type capping layer.

3. A semiconductor light emission device as defined in either one of claims 1 and 2 in which said n-type clad layer, active layer, p-type clad layer and p-type capping layer are of an $Al_xIn_yGa_{1-n-y}N(0 \leq x, y \leq 1)$ type.

4. An $Al_xIn_yGa_{1-n-y}N(0 \leq x, y \leq 1)$ type semiconductor light emission device comprising a semiconductor layer formed on a substrate, said substrate being made of an insulating material, the semiconductor layer including at least a p-type clad layer, an active layer and an n-type clad layer formed on the substrate in this order, the semiconductor layer being electronically connected to an n-side electrode formed on the semiconductor layer only through a narrow stripe portion formed on the semiconductor layer and/or the n-side electrode, thereby causing the semiconductor light emission device to oscillate in a single mode, and a p-side electrode being formed on the side of the p-type clad layer;

wherein the contact area between the p-side electrode and the semiconductor layer is larger than the area of the stripe portion.

* * * * *